United States Patent
Bois et al.

(10) Patent No.: US 6,797,938 B2
(45) Date of Patent: Sep. 28, 2004

(54) POLARIMETRIC OPTICAL DEVICE WITH AN INSULATING LAYER BETWEEN DETECTORS

(75) Inventors: Philippe Bois, Cesson (FR); Eric Costard, Massy (FR); Marcel-Francis Audier, Paris (FR); Eric Herniou, Gif sur Yvette (FR)

(73) Assignee: Thales, Paris (FR)

( * ) Notice: Subject to any disclaimer, the term of this patent is extended or adjusted under 35 U.S.C. 154(b) by 47 days.

(21) Appl. No.: 10/275,893
(22) PCT Filed: May 11, 2001
(86) PCT No.: PCT/FR01/01439
 § 371 (c)(1),
 (2), (4) Date: Nov. 12, 2002
(87) PCT Pub. No.: WO01/86724
 PCT Pub. Date: Nov. 15, 2001
(65) Prior Publication Data
 US 2003/0146374 A1 Aug. 7, 2003
(30) Foreign Application Priority Data
 May 12, 2000 (FR) .......................................... 00 06073
(51) Int. Cl.$^7$ ................................................. G02F 1/01
(52) U.S. Cl. .................... 250/225; 250/214.1; 257/431
(58) Field of Search ........................... 250/225, 214.1, 250/237 R; 257/431–432

(56) References Cited

U.S. PATENT DOCUMENTS

| | | |
|---|---|---|
| 5,086,327 A | 2/1992 | Rosencher et al. |
| 5,187,715 A | 2/1993 | Weisbuch et al. |
| 5,326,984 A | 7/1994 | Rosencher et al. |
| 5,506,418 A | 4/1996 | Bois et al. |
| 5,677,544 A | 10/1997 | Duboz et al. |
| 5,869,844 A | 2/1999 | Rosencher et al. |
| 6,091,126 A | 7/2000 | Costard et al. |
| 6,157,020 A | 12/2000 | Krapf et al. |
| 6,573,578 B2 * | 6/2003 | Kimura et al. ............... 257/431 |
| 6,580,089 B2 * | 6/2003 | Bandara et al. ............... 257/14 |

* cited by examiner

Primary Examiner—Stephone B. Allen
Assistant Examiner—Patrick J. Lee
(74) Attorney, Agent, or Firm—Oblon, Spivak, McClelland, Maier & Neustadt, P.C.

(57) ABSTRACT

This optical polarimetric detector comprises:
 a first active detector element having a photoconductor (1) with which a first diffraction grating (3) is associated allowing incident light from a first specific polarization direction to be coupled in the first detector element and allowing the latter to detect the light having this first polarization direction;
 a second active detector element having a photoconductor (1') with which a second diffraction grating (3') is associated allowing incident light from a second polarization direction to be coupled in the second detector element and allowing the latter to detect the light having this second polarization direction.

Furthermore, a detector (2) is provided making it possible to eliminate the background noise detected by previous detectors.

13 Claims, 2 Drawing Sheets

| | APPLIED BIASES | BIAS $V_1$ | BIAS $V_2$ | BIAS $V_{ref}$ |
|---|---|---|---|---|
| MODE 1 | SUBTRACTIVE H | YES | NO | YES |
| MODE 2 | SUBTRACTIVE V | NO | YES | YES |
| MODE 3 | SUBTRACTIVE H+V | YES | YES | YES |

POLARIMETRIC OPTICAL DEVICE WITH AN INSULATING LAYER BETWEEN DETECTORS

The invention relates to an optical polarimetric detector making it possible to detect two polarizations and, at the same time, eliminating the background noise.

The object of the present invention is to describe the architecture making it possible to combine two specific functionalities already demonstrated by quantum well detectors; the possibility of producing bispectral devices (French patent No. 2 756 667) and the possibility of producing detectors integrating, in the active layer, the function of subtracting the continuous component, that is to say the dark current of thermal origin and the optical scene current (French patent No. 2 756 666). Each of these two functions requires a double stack of quantum wells and three stage connector technology. The invention makes it possible to keep this number of stacks and of connector technology stages, while making it possible to read in subtractive mode and according to three, vertical (V), horizontal (H) and mixed (V+H) polarimetric templates.

The invention therefore relates to a bifunctional optical detector comprising:
  a first active detector element having a photoconductor with which a first diffraction grating is associated allowing incident light from a first specific polarization direction to be coupled in the first detector element and allowing the latter to detect the light having this first polarization direction;
  a second active detector element having a photoconductor with which a second diffraction grating is associated allowing incident light from a second polarization direction to be coupled in the second detector element and allowing the latter to detect the light having this second polarization direction.

The invention also relates to a method of producing such a detector.

Figure 1:
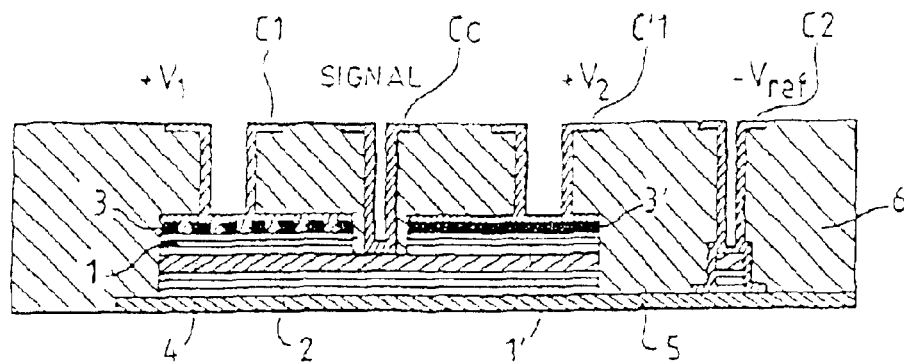
Figure 2:
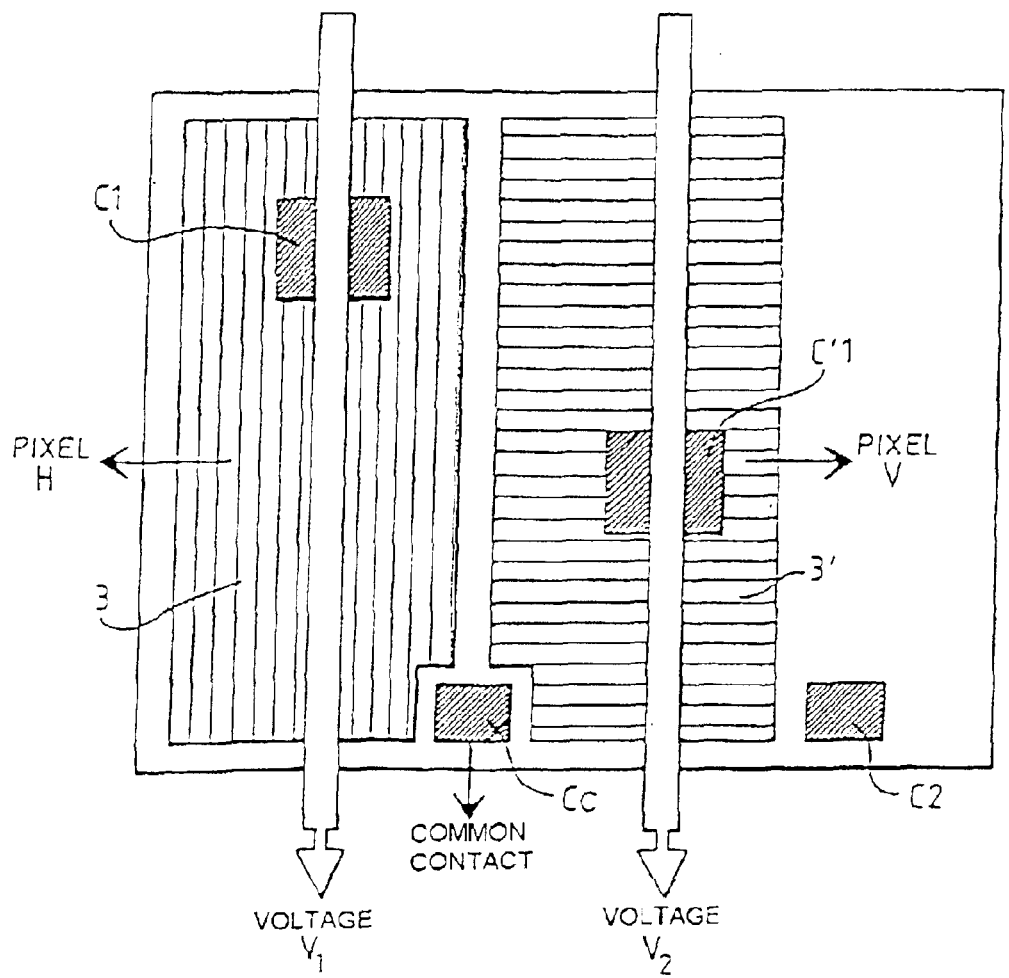
Figures 3, 4:
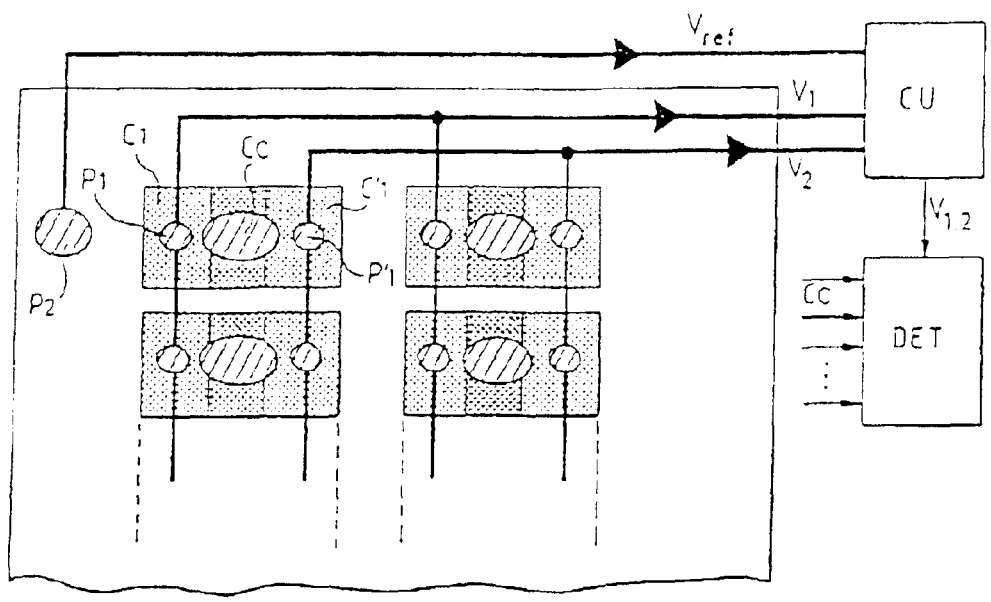

The various objects and features of the invention will become apparent on reading the description and the appended figures:
  FIG. 1, an exemplary structure of a detector according to the invention;
  FIG. 2, a top view of the structure of FIG. 1;
  FIG. 3, a matrix of detectors according to the invention;
  FIG. 4, a table of operation modes.

The proposed architecture is identical to that of a subtractive component. The spectral response of a quantum well detector is the convolution of the spectral absorption of the detector and of the spectral efficiency induced by the geometric resonance of the diffraction grating used for the optical coupling of the incident radiation. Thus, a one-dimensional diffraction grating resonating around $\lambda$ and oriented in a specific direction (or in a perpendicular direction) coupled to the quantum structure described above will induce an optical response centered around $\lambda$ and sensitive to the vertically (or horizontally) polarized incident light.

The principle of the invention is to separate the main pixel of size a×a into two subpixels of size a×a/2, each of these subpixels being a conventional subtractive structure, but having two different coupling arrays (FIGS. 1 and 2).

The bias of the lower stage Vref, common to the set of pixels remains common to both types of subpixels. On the other hand, the biased of the upper stage, which is also common to the set of pixels, must be divided in two, each subarray of subpixels being biased in a common manner.

The connection technology of the upper stage is, in this case, provided by two bias lines $V_1$ and $V_2$ per pixel instead of a single line for a standard subtractive pixel, as will be seen in FIG. 4.

The device may then be used in three subtractive modes corresponding to the three different polarization modes V, H and H+V, depending on the bias voltages which are applied to each of the upper electrodes (FIG. 4).

According to a preferred embodiment of the invention, an optical detector is produced on a transparent substrate through which the incident light reaches the detector. An optical detector of this type therefore comprises, on the substrate, a structure such as shown in FIG. 1. This structure comprises, on one face of the substrate, a first ohmic contact layer 5, this ohmic contact layer being transparent. A stack of layers 2 forming a stack of quantum wells capable of detecting at least one range of wavelengths is located on this ohmic contact layer. A second transparent ohmic contact layer 4 is on this stack of layers. Two identical or almost identical stacks of layers 1, 1', each one forming a stack of quantum wells capable of detecting at least one range of wavelengths $\lambda$, are on the second ohmic contact layer and finally, diffraction gratings 3 and 3' having different structures are on each of these stacks of layers. Each of these gratings allow either the light polarized in one direction (for example vertical) or the light polarized perpendicularly (horizontally) to be coupled in the stack of layers (1, 1' on which the grating is produced). To do this, the two gratings are oriented perpendicularly (see FIG. 2).

As shown in FIG. 1, the assembly is encapsulated in an insulating layer 6 and connection means pass through this insulating layer in order to reach the diffraction gratings and produce connection means C1 and C'1 enabling voltages +V1 and +V2 to be applied respectively to the diffraction gratings 3 and 3'. Also, at least one connection means passes through the insulating layer and reaches the second ohmic contact layer 4 so as to produce the common contact Cc allowing the photoconduction signal to be read. And finally, a connection means C2 is produced on the first ohmic contact layer 5 so that the voltage −Vref can be applied to the assembly of the structure.

FIG. 2 shows, in top view, a pair of detector elements like that of FIG. 1. In the exemplary embodiment of FIG. 1, the stack of quantum well layers 2 in fact forms two elementary detectors, each of them being associated with a detector element 1 or 1' for the purpose of eliminating the background noise as was explained in French patent No. 2 756 666.

The stacks of quantum well layers 1, 1', 2 are active or photoconducting at the same ranges of wavelengths $\lambda$. The stacks of layers 1 and 1' are designed so as to be more absorbing at wavelengths $\lambda$ than the stack of layer 2. The stack of layer 2 is preferably designed so as to be virtually nonabsorbing. This may be achieved by different thicknesses of the stacks of layers or by greater doping of the quantum well layers of the more absorbing stacks.

Since the detector is illuminated by incident radiation on the ohmic contact layer 5, the stack of layers 2 receives the radiation first. The latter therefore passes through the stack of layers 2 then the stacks of layers 1 and 1' and they are coupled by the diffraction gratings 3 and 3', depending on the polarization of the light in the stacks of layers 1 and 1'.

Although the diffraction grating 3 is provided in order to couple the vertically polarized light, the vertically polarized light will be diffracted toward the stack of layer 1 and will be absorbed or almost absorbed by this stack of layers. Similarly, although the diffraction grating 3' is provided in order to diffract horizontally polarized light, the horizontally polarized light will be absorbed or almost absorbed by the stack of layer 1'.

FIG. 3 shows a matrix embodiment of a detector according to the invention. In this figure, four optical detectors as described above have been shown by way of example. Each detector therefore comprises two detector elements, each one with its diffraction grating. In this figure, the connection means making it possible to control, in a matrix manner, this matrix of detectors is essentially shown. It can therefore be seen in this FIG. 3 that the connection means C1 are interconnected by their contact P1 to the control potential V1. Similarly, the connection means C'1 are interconnected by their connection contact P'1 to the same control potential V2. The common contact layer, to which a contact P2 is connected, is connected to the reference potential Vref. Finally, in the central part of each detector, a connection means Cc is located making it possible to connect an individual current measuring means for each detector.

In FIG. 3, a control circuit CU is also shown making it possible to deliver the reference potential Vref and the control potentials V1 and V2.

A detection circuit DET receives information v1.2 indicating the control mode delivered by the circuit CU (potentials V1 and/or V2) from the control circuit CU. It also receives read signals delivered by each pixel to its common contact means Cc.

FIG. 4 gives a control table for detectors produced in this way. This table thus illustrates the control of the detectors by the circuit CU. As can be seen in this FIG. 4, in operating mode, a reference potential Vref is applied to the various detectors. When a potential V1 is applied to one detector and no potential V2 is applied, this detector makes it possible to detect horizontally polarized light of wavelength λ. Conversely, if a potential V2 is applied but no potential V1 is applied to a detector, the latter detects the vertically polarized light (of wavelength λ). Finally, if both potentials V1 and V2 are applied to a detector, this makes it possible to detect both polarizations.

The normal operating mode may be considered as being the third mode, in order to acquire the maximum signal. The alternating use of modes 1 and 2 allows a polarimetry function to be added. Finally, in the event of optical countermeasure attack of one of the two polarizations, it is noted that the system can continue to operate and to acquire the signal in the other polarization.

An example of a method for producing a detector according to the invention will now be described. To simplify the description, the production of a detector comprising two detector elements such as the detector of FIG. 1 will be considered, but the application of this method could relate to producing a matrix of detectors.

This method comprises the following steps:

A first ohmic contact layer 5, transparent to the wavelengths to be detected, is produced on a transparent substrate (not shown in FIG. 1).

A stack of quantum wells able to be photoconducting at a range of wavelengths λ is produced on this ohmic contact layer.

A second ohmic contact layer, transparent to the wavelengths to be detected, is then produced.

A second stack of quantum wells, able to be photoconducting at the range of wavelengths λ, is produced on this second ohmic contact layer.

Two diffraction gratings, oriented perpendicularly in order to diffract light to the second stack of quantum wells, each for different polarizations, are produced on this second stack.

The geometry of each detector is then defined by etching. To do this, the assembly of layers is etched to the first ohmic contact layer 5. A groove is also produced between the two detector elements, at the boundary of the two gratings 3 and 3', so that the stacks of layers 1 and 1' of the two detector elements are also separated.

An insulating encapsulation layer 6 is deposited on the assembly thus obtained.

Finally, the connection means are produced. To do this, the following holes are made:
(a) the holes passing through the insulating layer to the diffraction gratings 3 and 3' which are metalized in order to form the connection means C1 and C'1;
(b) the common connection hole passing through the insulating layer and the second stack to the second ohmic contact layer in order to form the common connection means Cc allowing [lacuna] the read signal;
(c) a hole passing through the insulating layer and reaching the first ohmic contact layer 5 so as to produce the connection means C2.

It should be noted that, in the foregoing, the diffraction gratings 3 and 3' may be metalized in order to apply the potentials V1 and V2.

Thus, the method of the invention has made it possible to produce the detector of FIG. 1. In order to produce a matrix of detectors, it would be appropriate to etch several detectors designed in this way on the first ohmic contact layer.

What is claimed is:

1. An optical polarimetric detector comprising:
   a first active detector element having a photoconductor with which a first diffraction grating is associated allowing incident light from a first polarization direction to be coupled in the first detector element and allowing the first detector element to detect the incident light having the first polarization direction; and
   a second active detector element having a photoconductor with which a second diffraction grating is associated allowing incident light from a second polarization direction to be coupled in the second detector element and allowing the second detector to detect the incident light having the second polarization direction.

2. The optical detector as claimed in claim 1, wherein the first diffraction grating is oriented to couple, in the first detector element, the incident light polarized in the first polarization direction and the second diffraction grating is oriented to couple, in the second detector, the incident light polarized in the second polarization direction.

3. The optical detector as claimed in claim 1, wherein the first and second detector elements are similar and allow a same range of wavelengths to be detected.

4. The optical detector as claimed in claim 1, wherein the first and second detector elements are produced in a same layer of a photoconducting material.

5. The optical detector as claimed in claim 4, wherein the first and second detector elements are produced in stacks of layers forming quantum wells.

6. The optical detector as claimed in claim 1, wherein the first detector element is associated with a third detector element separated by one of a common contact layer and an insulating layer; a fourth detector element also being associated with the second detector element and separated from the second detector element by a contact layer or an insulating layer; the first, second, third, and fourth detector elements being photoconducting under effect of a same range of wavelengths.

7. The optical detector as claimed in claim 6, wherein the common contact layer or insulating layer form a same layer, and wherein the third detector element and the fourth detector element also form a same detector element.

8. The optical detector as claimed in claim 6, wherein the first, second, third, and fourth detector elements enable the same ranges of wavelengths to be detected.

9. The optical detector as claimed in claim 8, wherein a response of the first and second detector elements is greater than a response of the third and fourth detector elements such that the third and fourth detector elements absorb light energy at a wavelength range for which they are photoconducting.

10. The optical detector as claimed in claim 9, wherein the first and second diffraction gratings are made of a conducting material or are coated by a conducting material and each diffraction grating comprises a first and a second contact means, and wherein the optical detector further comprises:
- a third contact means connected to faces of any of the first, second, third, and fourth detector elements that are in contact with the common contact or insulating layer;
- fourth contact means in contact with the third and fourth detector elements on faces away from the common contact or insulating layer;
- means for applying control voltages to the first, second, and fourth contact means; and
- current conduction measuring means connected to the third contact means for measuring photoconduction of the detector elements.

11. The optical detector as claimed in claim 10, further comprising control means for making possible applying a reference voltage to the fourth contact means together with:
- either a first control voltage to the first contact means to control operation of the first and third detector elements;
- or a second control voltage to the second contact means to control operation of the second and fourth detector elements;
- or both first and second control voltages to control operation of the first, second, third, and fourth detector elements.

12. The optical detector as claimed in calm 11, further comprising a matrix of detector elements, the fourth contact means being common to all the detector elements to be able to apply a voltage to all the detector elements of the matrix, all the first contact means being connected together to apply, on demand, the first control voltage to all the first detector elements of the matrix, all the second contact means being connected together to be able to apply, on demand, the second control voltage to all the second detector elements of the matrix.

13. The optical polarimetric detector of claim 1 made by a method comprising:
- producing an ohmic contact layer on a face of a transparent substrate;
- producing a first stack of layers forming a stack of quantum wells allowing a range of wavelengths to be detected, on said ohmic contact layer;
- producing a second ohmic contact layer on the first stack of layers;
- producing a second stack of layers forming a stack of quantum wells allowing a range of wavelengths to be detected, on the second ohmic contact layer;
- producing layers of at least two diffraction gratings having different physical structures, on a surface of the second stack of layers;
- etching at least two detector elements in an assembly of layers obtained until reaching the first ohmic contact layer, a first of the at least two detector elements having a diffraction grating oriented in a first direction and a second of the at least two detector elements having a diffraction grating oriented in a direction perpendicular to the first direction;
- encapsulating the assembly in an insulating layer;
- etching first holes in the insulating layer, which pass through the insulating layer and reach the diffraction gratings, and metalizing the first holes to produce the first and second contact means;
- producing at least one second hole per pair of detector elements, said at least one second hole reaching the second ohmic contact layer, and metalizing the at least one second hole to produce the third contact means;
- producing a third hole passing through the insulator and reaching the first ohmic contact layer and metalizing the third hole to produce the fourth contact means.

* * * * *